United States Patent
Lin et al.

(10) Patent No.: US 12,216,413 B2
(45) Date of Patent: *Feb. 4, 2025

(54) DEVICE AND METHOD TO REMOVE DEBRIS FROM AN EXTREME ULTRAVIOLET (EUV) LITHOGRAPHY SYSTEM

(71) Applicant: TAIWAN SEMICONDUCTOR MANUFACTURING COMPANY, LTD., Hsinchu (TW)

(72) Inventors: Chun-Han Lin, Hsinchu (TW); Chieh Hsieh, Taoyuan (TW); Sheng-Kang Yu, Hsinchu (TW); Shang-Chieh Chien, New Taipei (TW); Heng-Hsin Liu, New Taipei (TW); Li-Jui Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/231,170

(22) Filed: Aug. 7, 2023

(65) Prior Publication Data

US 2023/0375950 A1 Nov. 23, 2023

Related U.S. Application Data

(63) Continuation of application No. 17/548,016, filed on Dec. 10, 2021.

(60) Provisional application No. 63/178,896, filed on Apr. 23, 2021.

(51) Int. Cl.
*G03F 7/00* (2006.01)
*H05G 2/00* (2006.01)

(52) U.S. Cl.
CPC ...... *G03F 7/70916* (2013.01); *G03F 7/70033* (2013.01); *H05G 2/008* (2013.01)

(58) Field of Classification Search
CPC .. G03F 7/70916; G03F 7/70033; H05G 2/008
See application file for complete search history.

(56) References Cited

U.S. PATENT DOCUMENTS

| | | | |
|---|---|---|---|
| 9,869,934 B2 | 1/2018 | Huang et al. | |
| 11,841,625 B2* | 12/2023 | Lin | H05G 2/008 |
| 2019/0011828 A1 | 1/2019 | Van Zwol et al. | |

OTHER PUBLICATIONS

Notice of Allowance issued in U.S. Appl. No. 17/548,016, dated Jul. 20, 2023.

* cited by examiner

*Primary Examiner* — Nicole M Ippolito
*Assistant Examiner* — Hanway Chang
(74) *Attorney, Agent, or Firm* — Studebaker & Brackett PC

(57) ABSTRACT

A method includes irradiating debris deposited in an extreme ultraviolet (EUV) lithography system with laser, controlling one or more of a wavelength of the laser or power of the laser to selectively vaporize the debris and limit damage to the EUV lithography system, and removing the vaporized debris.

20 Claims, 7 Drawing Sheets

DEVICE AND METHOD TO REMOVE DEBRIS FROM AN EXTREME ULTRAVIOLET (EUV) LITHOGRAPHY SYSTEM

CROSS REFERENCE TO RELATED APPLICATION

This application is a continuation application of and claims priority to U.S. non-provisional application Ser. No. 17/548,016 filed Dec. 10, 2021, which claims priority of U.S. Provisional Patent Application No. 63/178,896 filed on Apr. 23, 2021, the entire contents both these applications are incorporated herein by reference.

BACKGROUND

The wavelength of radiation used for lithography in semiconductor manufacturing has decreased from ultraviolet to deep ultraviolet (DUV) and, more recently to extreme ultraviolet (EUV). Further decreases in component size require further improvements in resolution of lithography which are achievable using extreme ultraviolet lithography (EUVL). EUVL employs radiation having a wavelength of about 1-100 nm. One method for producing EUV radiation is laser-produced plasma (LPP). In an LPP-based EUV source, a high-power laser beam is focused on small droplet targets of metal, such as tin, to form a highly ionized plasma that emits EUV radiation with a peak maximum emission at 13.5 nm.

The collector mirror reflectance is an important factor in an EUV radiation source for an EUVL system. The reflective quality of the collector mirror directly affects the power and wavelength of the reflected EUV light rays. A low quality collector mirror having uneven thickness, uneven surface roughness, and non-uniform reflectance of layers in the mirror, reduces the total amount of reflected EUV light rays and the reflected EUV light rays have a lower power and different or a mixture of wavelengths, compared with the EUV light rays directly generated from the plasma. The collector mirror is subject to contamination. For example, plasma formation during the EUV light ray generation also generates debris which may deposit on the reflective surface of the collector mirror, thereby contaminating the reflective surface of the collector mirror and lowering the quality of the reflected EUV light rays. Thus, EUV collector mirrors have a limited service life, as they tend to be fouled by accumulating tin debris, which degrades the reflectance of the collector mirror when in use. Thus, the EUV collector mirror needs to be replaced due to the debris contamination. Each time a fouled/contaminated collector mirror is replaced, several days of production are lost for the EUVL system, because the optics between the collector mirror, source, and scanner have to be re-aligned.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
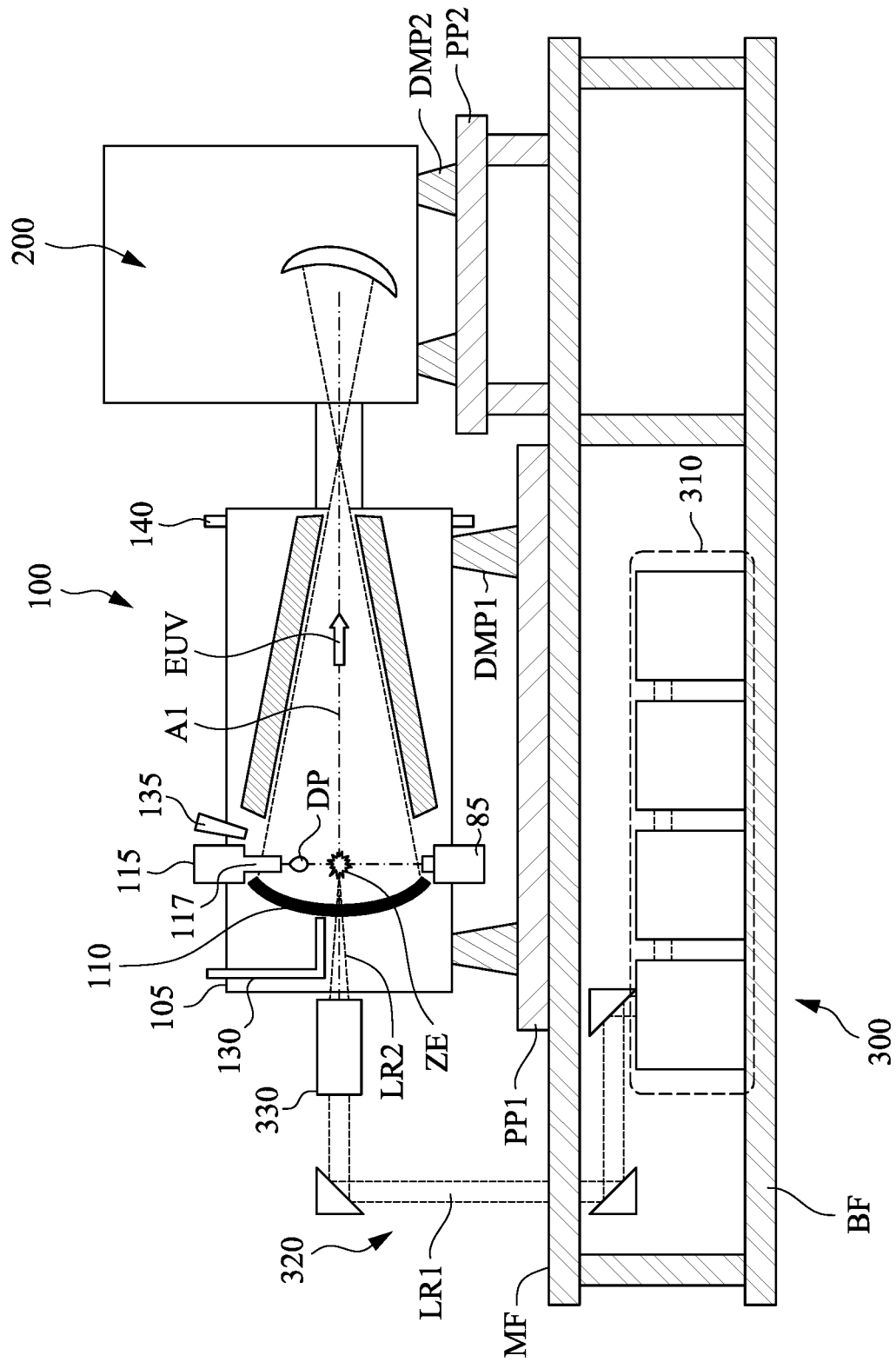
FIG. 1 is a schematic view of an EUV lithography system with a laser produced plasma (LPP) EUV radiation source in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Embodiments of the present disclosure generally relate to extreme ultraviolet lithography (EUVL) systems and methods. More particularly, embodiments are related to apparatuses and methods for cleaning debris accumulated on components inside the EUV radiation source, such as an intermediate focus (IF)-cap module of an extreme ultraviolet (EUV) lithography system. An unclean intermediate focus (IF)-cap module will lead to faster accumulation of Sn, and will result in Sn fall-on. Using the embodiments of the disclosure, the Sn fall-on can be reduced and an improved EUV productivity yield is obtained.

In a laser produced plasma (LPP) EUV radiation source, a collector mirror, also referred to as an LPP collector mirror or an EUV collector mirror, collects and reflects EUV radiation and contributes to overall EUV conversion efficiency. The excitation laser heats metal (e.g., tin) target droplets in the LPP chamber to ionize the droplets to a plasma which emits the EUV radiation, which is focused into the EUV beam and is incident on the reticle. During laser-metal interaction, a tin droplet may be missed by or not interact sufficiently with the laser beam, forming debris. Also, some tin leftover from the plasma formation process can become debris. The debris can accumulate on the surface of the EUV collector mirror, deteriorating the reflective quality of the EUV collector mirror. The debris is also collected in a droplet catcher and accumulates on the inner surface of the intermediate-focus (IF) cap module. Existing tools for cleaning the debris from the intermediate-focus (IF) cap module include a tool having a chisel that is used to scrape the debris from the inner surface of the intermediate-focus (IF) cap module and a brush to remove the scraped debris from the intermediate-focus (IF) cap module. However, the cleaning process is time consuming and inefficient. Scraping does not remove all debris and some debris is left behind on the intermediate-focus (IF) cap module. One disadvantage of scraping is that the process creates a tin (Sn) particle cloud that can migrate to other portions of the extreme ultraviolet (EUV) lithography system. For instance, the tin (Sn) particles can migrate to the exposure device and deposit on the reticle and cause damage to the reticle and/or errors during EUV exposure. An unclean intermediate-focus (IF) cap module will result in tin debris accumulating at a faster rate, which will in turn require more frequent cleaning. Thus, the intermediate-focus (IF) cap module clean lifetime is shortened. In addition, as more and more debris accumulates, the debris enters into the path of the EUV radiation and disrupt the EUV radiation into the EUV scanner. The accumulated debris will also lead to tin (Sn) spitting when the EUV tool is under exposure, and there will be the risk of Sn fall-on. In tin spitting, the increase in temperature during operation melts the accumulated tin in the intermediate-focus (IF) cap module and the tin is transported to the EUV scanner and eventually to the reticle. As a result, the reticle is damaged.

FIG. 1 is a schematic view of an extreme ultraviolet (EUV) lithography system with a LPP-based EUV radiation source, in accordance with some embodiments of the present disclosure. The EUV lithography system includes an EUV radiation source 100 (an EUV light source) to generate EUV radiation, an exposure device 200, such as a scanner, and an excitation laser source 300. As shown in FIG. 1, in some embodiments, the EUV radiation source 100 and the exposure device 200 are installed on a main floor MF of a clean room, while the excitation laser source 300 is installed in a base floor BF located under the main floor. Each of the EUV radiation source 100 and the exposure device 200 are placed over pedestal plates PP1 and PP2 via dampers DMP1 and DMP2, respectively. The EUV radiation source 100 and the exposure device 200 are coupled to each other by a coupling mechanism, which may include a focusing unit.

The lithography system is an EUV lithography system designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optical components, such as convex/concave/flat mirrors, a mask holding mechanism including a mask stage, and wafer holding mechanism. The EUV radiation generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss. The exposure device 200 is described in more details with respect to FIG. 2.

In the present disclosure, the terms mask, photomask, and reticle are used interchangeably. In some embodiments, the mask is a reflective mask. In some embodiments, the mask includes a substrate with a suitable material, such as a low thermal expansion material or fused quartz. In various examples, the material includes $TiO_2$ doped $SiO_2$, or other suitable materials with low thermal expansion. The mask includes multiple reflective layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The exposure device 200 includes a projection optics module for imaging the pattern of the mask on to a semiconductor substrate with a resist coated thereon secured on a substrate stage of the exposure device 200. The projection optics module generally includes reflective optics. The EUV radiation (EUV light) directed from the mask, carrying the image of the pattern defined on the mask, is collected by the projection optics module, thereby forming an image on the resist.

In various embodiments of the present disclosure, the semiconductor substrate is a semiconductor wafer, such as a silicon wafer or other type of wafer to be patterned. The semiconductor substrate is coated with a resist layer sensitive to the EUV light in presently disclosed embodiments. Various components including those described above are integrated together and are operable to perform lithography exposing processes. The lithography system may further include other modules or be integrated with (or be coupled with) other modules.

As shown in FIG. 1, the EUV radiation source 100 includes a target droplet generator 115 and a LPP collector mirror 110, enclosed by a chamber 105. A droplet DP that does not interact goes to droplet catcher 85. The target droplet generator 115 generates a plurality of target droplets DP, which are supplied into the chamber 105 through a nozzle 117. In some embodiments, the target droplets DP are tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, each having a diameter of about 10 μm, about 25 μm, about 50 μm, or any diameter between these values. In some embodiments, the target droplets DP are supplied through the nozzle 117 at a rate in a range from about 50 droplets per second (i.e., an ejection-frequency of about 50 Hz) to about 50,000 droplets per second (i.e., an ejection-frequency of about 50 kHz). For example, in an embodiment, target droplets DP are supplied at an ejection-frequency of about 50 Hz, about 100 Hz, about 500 Hz, about 1 kHz, about 10 kHz, about 25 kHz, about 50 kHz, or any ejection-frequency between these frequencies. The target droplets DP are ejected through the nozzle 117 and into a zone of excitation ZE at a speed in a range from about 10 meters per second (m/s) to about 100 m/s in various embodiments. For example, in an embodiment, the target droplets DP have a speed of about 10 m/s, about 25 m/s, about 50 m/s, about 75 m/s, about 100 m/s, or at any speed between these speeds.

The excitation laser beam LR2 generated by the excitation laser source 300 is a pulsed beam. The laser pulses of laser beam LR2 are generated by the excitation laser source 300. The excitation laser source 300 may include a laser generator 310, laser guide optics 320 and a focusing apparatus 330. In some embodiments, the laser generator 310 includes a carbon dioxide ($CO_2$) or a neodymium-doped yttrium aluminum garnet (Nd:YAG) laser source with a wavelength in the infrared region of the electromagnetic spectrum. For example, the laser source 310 has a wavelength of 9.4 μm or 10.6 μm, in an embodiment. The laser light beam LR1 generated by the laser source 300 is guided by the laser guide optics 320 and focused, by the focusing apparatus 330, into the excitation laser beam LR2 that is introduced into the EUV radiation source 100. In some embodiments, in addition to $CO_2$ and Nd:YAG lasers, the laser beam LR2 is generated by a gas laser including an excimer gas discharge laser, helium-neon laser, nitrogen laser, transversely excited atmospheric (TEA) laser, argon ion laser, copper vapor laser, KrF laser or ArF laser; or a solid state laser including Nd:glass laser, ytterbium-doped glasses or ceramics laser, or ruby laser.

In some embodiments, the excitation laser beam LR2 includes a pre-heat laser pulse and a main laser pulse. In such embodiments, the pre-heat laser pulse (interchangeably referred to herein as the "pre-pulse) is used to heat (or pre-heat) a given target droplet to create a low-density target plume with multiple smaller droplets, which is subsequently heated (or reheated) by a pulse from the main laser (main pulse), generating increased emission of EUV light compared to when the pre-heat laser pulse is not used.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser beam LR2 is matched with the ejection-frequency of the target droplets DP in an embodiment.

The laser beam LR2 is directed through windows (or lenses) into the zone of excitation ZE. The windows adopt a suitable material substantially transparent to the laser beams. The generation of the laser pulses is synchronized with the ejection of the target droplets DP through the nozzle 117. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation, which is collected by the collector mirror 110. The collector mirror 110, an EUV collector mirror, further reflects and focuses the EUV radiation for the lithography exposing processes performed through the exposure device 200.

One method of synchronizing the generation of a pulse (either or both of the pre-pulse and the main pulse) from the excitation laser with the arrival of the target droplet in the zone of excitation is to detect the passage of a target droplet at given position and use it as a signal for triggering an excitation pulse (or pre-pulse). In this method, if, for example, the time of passage of the target droplet is denoted by $t_o$, the time at which EUV radiation is generated (and detected) is denoted by $t_{rad}$, and the distance between the position at which the passage of the target droplet is detected and a center of the zone of excitation is d, the speed of the target droplet, $v_{dp}$, is calculated as $$v_{dp} = d/(t_{rad} - t_o) \quad \text{Equation (1).}$$

Because the droplet generator is expected to reproducibly supply droplets at a fixed speed, once $v_{dp}$ is calculated, the excitation pulse is triggered with a time delay of $d/v_{dp}$ after a target droplet is detected to have passed the given position to ensure that the excitation pulse arrives at the same time as the target droplet reaches the center of the zone of excitation. In some embodiments, that the passage of the target droplet is used to trigger the pre-pulse, the main pulse is triggered following a fixed delay after the pre-pulse. In some embodiments, the value of target droplet speed $v_{dp}$ is periodically recalculated by periodically measuring $t_{rad}$, if needed, and the generation of pulses with the arrival of the target droplets is resynchronized.

In an EUV radiation source 100, the plasma caused by the laser application creates debris, such as ions, gases and atoms of the droplet, as well as the desired EUV radiation. It is necessary to prevent the accumulation of material, e.g., debris, on the collector mirror 110 and also to prevent debris exiting the chamber 105 and entering the exposure device 200.

As shown in FIG. 1, a buffer gas is supplied from a first buffer gas supply 130 through the aperture in collector mirror 110 by which the pulse laser is delivered to the tin droplets. In some embodiments, the buffer gas is $H_2$, He, Ar, N or another inert gas. In certain embodiments, $H_2$ is used as H radicals that are generated by ionization of the buffer gas and can be used for cleaning purposes. The buffer gas can also be provided through one or more second buffer gas supplies 135 toward the collector mirror 110 and/or around the edges of the collector mirror 110. Further, the chamber 105 includes one or more gas outlets 140 so that the buffer gas is exhausted outside the chamber 105. Hydrogen gas has low absorption to the EUV radiation. Hydrogen gas reaching to the coating surface of the collector mirror 110 reacts chemically with a metal of the droplet forming a hydride, e.g., metal hydride. When tin (Sn) is used as the droplet, stannane ($SnH_4$), which is a gaseous byproduct of the EUV generation process, is formed. The gaseous $SnH_4$ is then pumped out through the gas outlet 140. However, it is difficult to exhaust all gaseous $SnH_4$ from the chamber and to prevent the $SnH_4$ from entering the exposure device 200. Therefore, monitoring and/or control of the debris in the EUV radiation source 100 is beneficial to the performance of the EUVL system.

Figure 2:
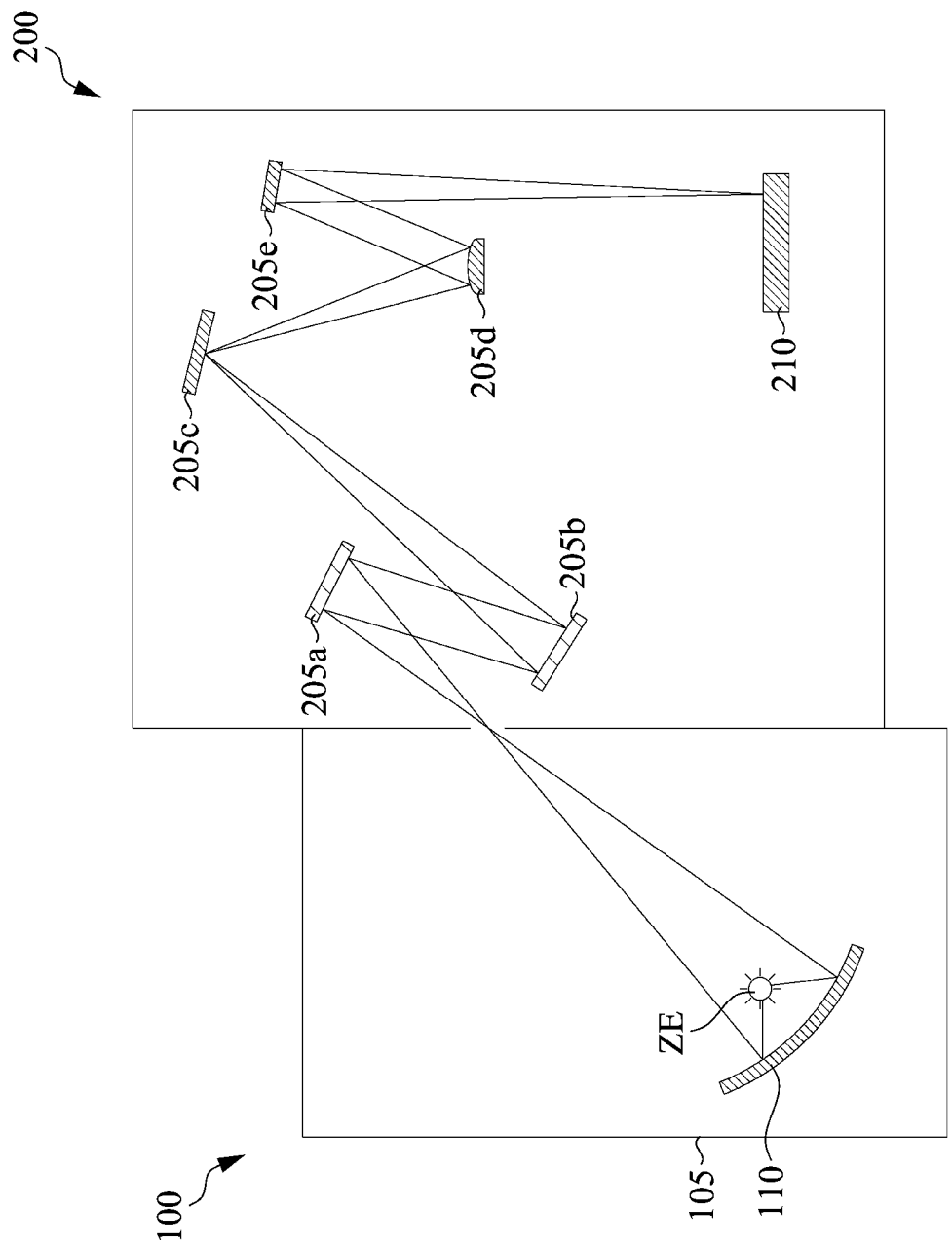
FIG. 2 is a schematic view of an EUV lithography exposure tool in accordance with some embodiments of the present disclosure.

FIG. 2 is a schematic view of an EUVL exposure tool in accordance with some embodiments of the present disclosure. The EUVL exposure tool of FIG. 2 includes the exposure device 200 that shows the exposure of photoresist coated substrate, a target substrate 210, with a patterned beam of EUV light. The exposure device 200 is an integrated circuit lithography tool such as a stepper, scanner, step and scan system, direct write system, device using a contact and/or proximity mask, etc., provided with one or more optics 205a, 205b, for example, to illuminate a patterning optic 205c, such as a reticle, with a beam of EUV light, to produce a patterned beam, and one or more reduction projection optics 205d, 205e, for projecting the patterned beam onto the target substrate 210. A mechanical assembly (not shown) may be provided for generating a controlled relative movement between the target substrate 210 and patterning optic 205c. As further shown, the EUVL exposure tool of FIG. 2, further includes the EUV radiation source 100 including a plasma plume 23 at the zone of excitation ZE emitting EUV light in the chamber 105 that is collected and reflected by a collector mirror 110 into the exposure device 200 to irradiate the target substrate 210.

Figure 3:
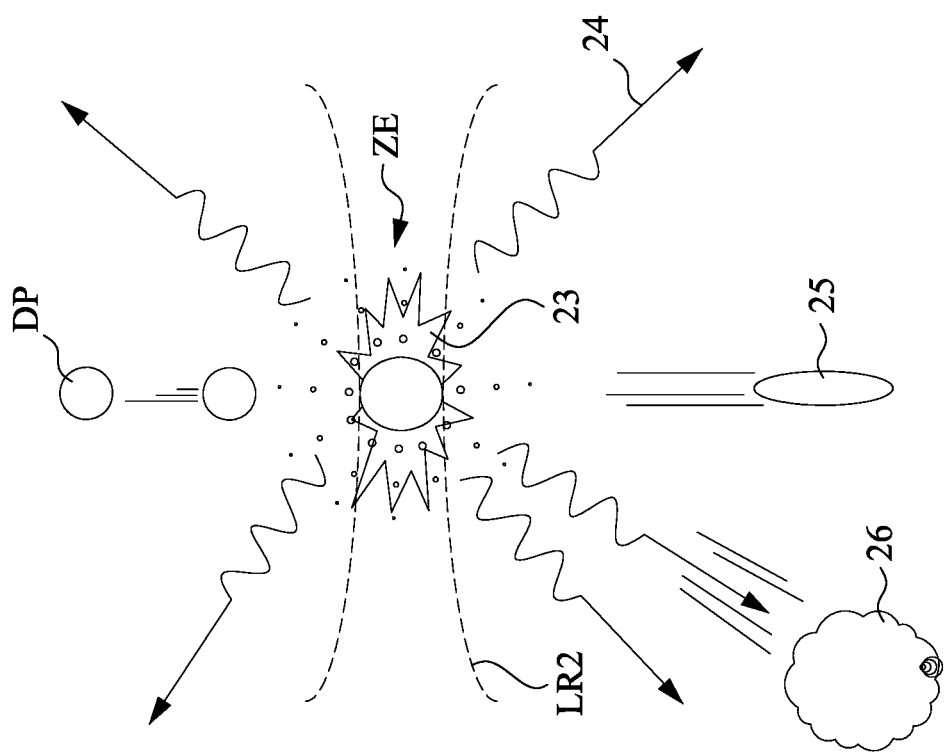
FIG. 3 shows a schematic view of plasma formation process through laser-metal interaction between a laser beam and a metal droplet in accordance with some embodiments of the present disclosure.

FIG. 3 shows a schematic view of plasma formation process through laser-metal interaction between a laser beam and a metal droplet in accordance with some embodiments of the present disclosure. In FIG. 3, the ejected metal droplet, e.g., the ejected tin droplet DP, reaches the zone of excitation ZE where it interacts with the laser beam LR2 to form a plasma. The zone of excitation ZE is at a focus of the high-power and high-pulse-repetition-rate pulsed laser beam LR2. The laser beam LR2 interacts with the ejected tin droplet DP at the ignition site in a space of the chamber of the EUVL system to form the plasma plume 23 which emits EUV light rays 24 in all directions. During this laser-metal interaction, a tin droplet DP could be missed by or not interact sufficiently with the laser beam LR2, thereby passing to a position below the zone of excitation ZE in FIG. 3, forming debris droplet 25. Also, the interaction between the laser beam LR2 and a droplet DP that creates the plasma plume 23 that includes active and highly charged particles or ions such as tin (Sn) ions, also creates a shock wave. The shock wave may push the next droplets DP away and cause a spatial positional error/tolerance between the tin droplet DP and the focus position of the laser beam LR2 at the zone of excitation ZE. At times, an error exists in synchronization between the pulse frequency of the laser beam LR2 and the speed of the ejected tin droplet DP such that when the pulsed laser that is directed to the zone of excitation ZE fires, it misses some droplets and the droplets that have not reached or have already passed the zone of excitation ZE, and thus, become debris droplets 25. The debris droplets 25, may deposit on the lower-half portion of the reflective surface of the collector mirror 110. Some tin leftover from the plasma formation process can become debris 26. The debris droplet 25 is collected in a droplet catcher 85, e.g., a tin catcher, while the debris 26 is deposited on the collector mirror 110 and/or on the intermediate-focus (IF) cap module 250 shown in FIG. 4A.

Figure 4A:
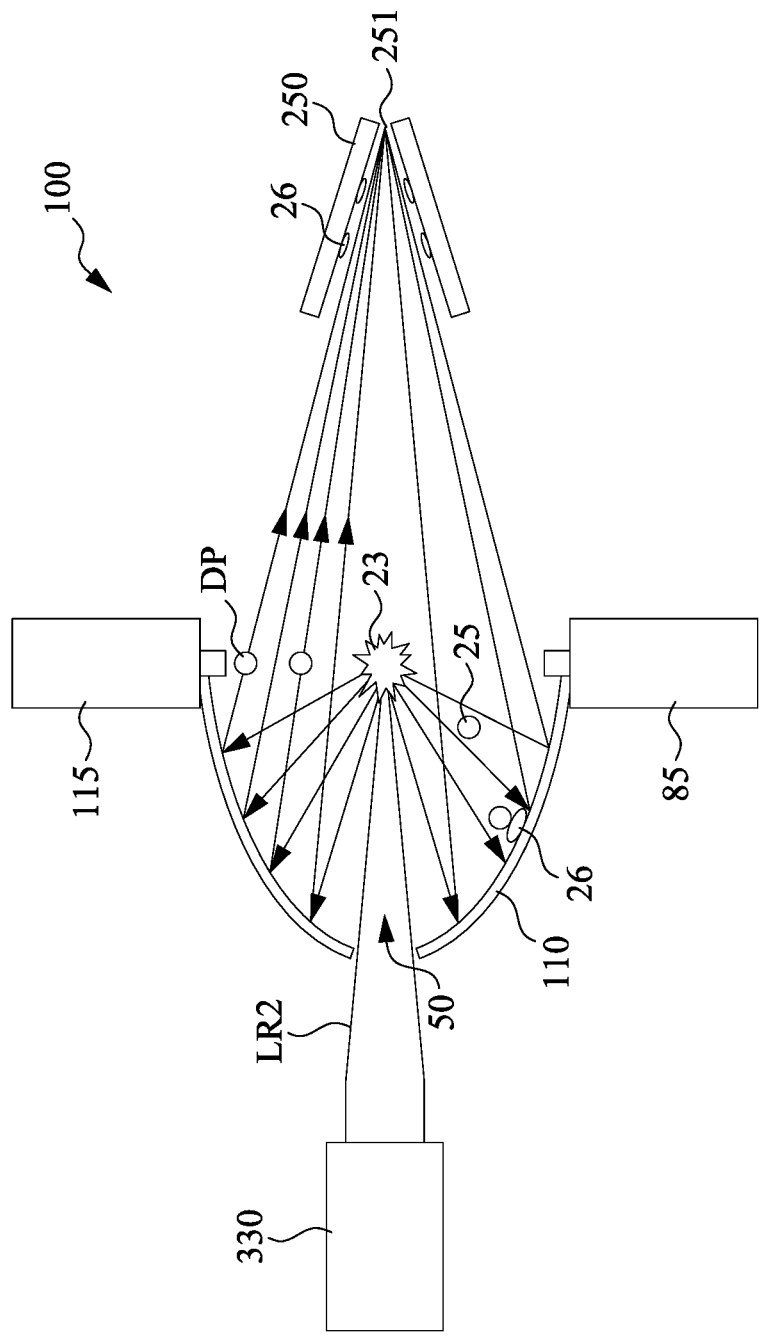
FIG. 4A shows a cross-sectional view of the EUV radiation source in an operation situation in accordance with some embodiments of the present disclosure.

FIG. 4A shows a cross-sectional view of the EUV radiation source 100 during a plasma formation process in accordance with some embodiments of the present disclosure. The EUV radiation source 100 includes the focusing apparatus 330, the collector mirror 110, the target droplet generator 115, an aperture 50 for entering the laser beam LR2, and a drain such as a droplet catcher 85, e.g., a tin catcher, for the unreacted tin droplets, the debris droplet 25. The collector mirror 110 is made of a multi-layered mirror including Mo/Si, La/B, La/$B_4$C, Ru/$B_4$C, Mo/$B_4$C, $Al_2O_3$/$B_4$C, W/C, Cr/C, and Cr/Sc with a capping layer including $SiO_2$, Ru, $TiO_2$, and $ZrO_2$, in some embodiments. The diameter of the collector mirror 110 can be about 330 mm to about 750 mm depending on the chamber size of the EUV radiation source 100. The cross-sectional shape of the collector mirror 110 can be elliptical or parabolic, in some embodiments. The radiation source 100 also includes an intermediate focus (IF)-cap module 250, such as an IF-cap quick-connect module configured to provide intermediate focus 251 to the EUV radiation. In some embodiments, the IF-cap module 250 is made of copper (Cu). The IF-cap module 250 may additionally function to obscure the laser beam 32, in some embodiments. As illustrated, tin debris 26 is deposited on the inner surface of the intermediate-focus (IF) cap module 250.

Since the plasma plume 23 includes active and highly charged particles or ions such as tin (Sn) ions, and a spatial positional error/tolerance may exist between the tin droplet DP and the focus position of the laser beam ZE, debris is formed and can be pushed by the high power radiation toward the collector mirror 110, causing contamination of the collector mirror 110. Also, due to the synchronization control the laser beam pulse frequency and the speed of the ejected tin droplet DP, some droplets are laser-missed and become debris droplets 25 and some droplet under react with the laser beam. The debris 26 can also deposit on the inner surface of the intermediate-focus (IF) cap module 250.

Embodiments are directed to apparatuses and methods for reducing the tin (Sn) debris that has been deposited on the intermediate focus (IF)-cap module. More specifically, embodiments of the disclosure are directed to using a high-frequency laser to remove the tin debris from the inner surface of the intermediate-focus (IF) cap module 250. The high-frequency laser is chosen such that damage to the intermediate-focus (IF) cap module 250 is minimized. The high-frequency laser vaporizes the tin debris and the vapors are vacuumed out. The frequency, energy, and/or the pulse width of the high-frequency laser can be optimized for more effective cleaning of the intermediate focus (IF)-cap module.

For the purpose of discussion, embodiments disclosed herein are directed to removing tin (Sn) debris from the intermediate focus (IF)-cap module using a fiber laser. However, embodiments are not limited in this regard. Other types of lasers can also be used to remove other debris/material that is deposited in other components of the extreme ultraviolet (EUV) lithography system, such as the exposure device 200, without departing from the scope of the disclosure.

The absorption wavelengths of a laser for tin (Sn) and the copper forming the intermediate focus (IF)-cap module 250 are different. The absorption wavelength of copper is about 600 nm and the absorption wavelength of tin is about 350 nm. A material will absorb incident light (radiation) when the wavelength of the incident light is less than the absorption wavelength of the material. The incident light when absorbed will excite the material and produce a physical phenomena, such as heat or luminescence.

In embodiments, the laser is generated having a wavelength greater than about 600 nm in order for the laser to not be absorbed by the tin and copper. Since the laser is not absorbed by copper of the intermediate-focus (IF) cap module 250, damage to the intermediate-focus (IF) cap module 250 is limited.

In some embodiments, the high-frequency laser is in a pulsed form (pulsed laser). As used herein, frequency of the laser refers to the number of pulses of the laser emitted/generated per unit time (e.g., per second). The frequency of the laser is chosen such that the power (energy) in the laser is high enough to heat the material the laser is incident upon to a high temperature relatively rapidly.

The melting point of tin (Sn) is around 230° C. and the melting point of copper is around 1080° C. The frequency (and thereby the power) of the laser is controlled such that tin debris when irradiated by the laser is heated relatively rapidly to a temperature of at least 230° C. and less than 1080° C. In some embodiments, the power of the laser is around 50 W to around 100 W. In other embodiments, the power of the laser is around 50 W to around 60 W. In other embodiments, the power of the laser is around 60 W to around 70 W. In other embodiments, the power of the laser is around 70 W to around 80 W. In other embodiments, the power of the laser is around 80 W to around 90 W. In other embodiments, the power of the laser is around 90 W to around 100 W. In other embodiments, the power of the laser is less than around 50 W. In other embodiments, the power of the laser is greater than around 100. In some embodiments, the object is heated to a temperature of at least 240° C. and less than 1000° C. In another embodiment, the object is heated to a temperature of at least 250° C. and less than 980° C. As a result, given the different melting temperatures of tin and copper, the copper does not melt, while tin (Sn) melts, as discussed below.

A cleaning operation is performed to remove the debris when it is determined that the debris accumulated on the surface of the intermediate focus (IF)-cap module 250 reaches or exceeds a certain desired level. The cleaning operation can be performed under atmospheric pressure conditions. During the cleaning operation, the tin debris 26 on the intermediate focus (IF)-cap module 250 is irradiated with the high-frequency laser. The laser increases the temperature of the tin debris 26 relatively rapidly. Due to the rapid increase in temperature, the tin is ionized and a plasma is formed. The plasma expands rapidly and the shock wave resulting from the rapid expansion vaporizes the tin debris 26. The vaporized tin debris is then removed, as discussed below. Since the copper does not melt, the tin debris can be selectively removed with minimal damage to the intermediate focus (IF)-cap module 250.

It is ensured that the pulse width of the laser is short enough to limit heat accumulation in the debris 26 and thereby limit damage to the intermediate-focus (IF) cap module 250.

Figure 4B:
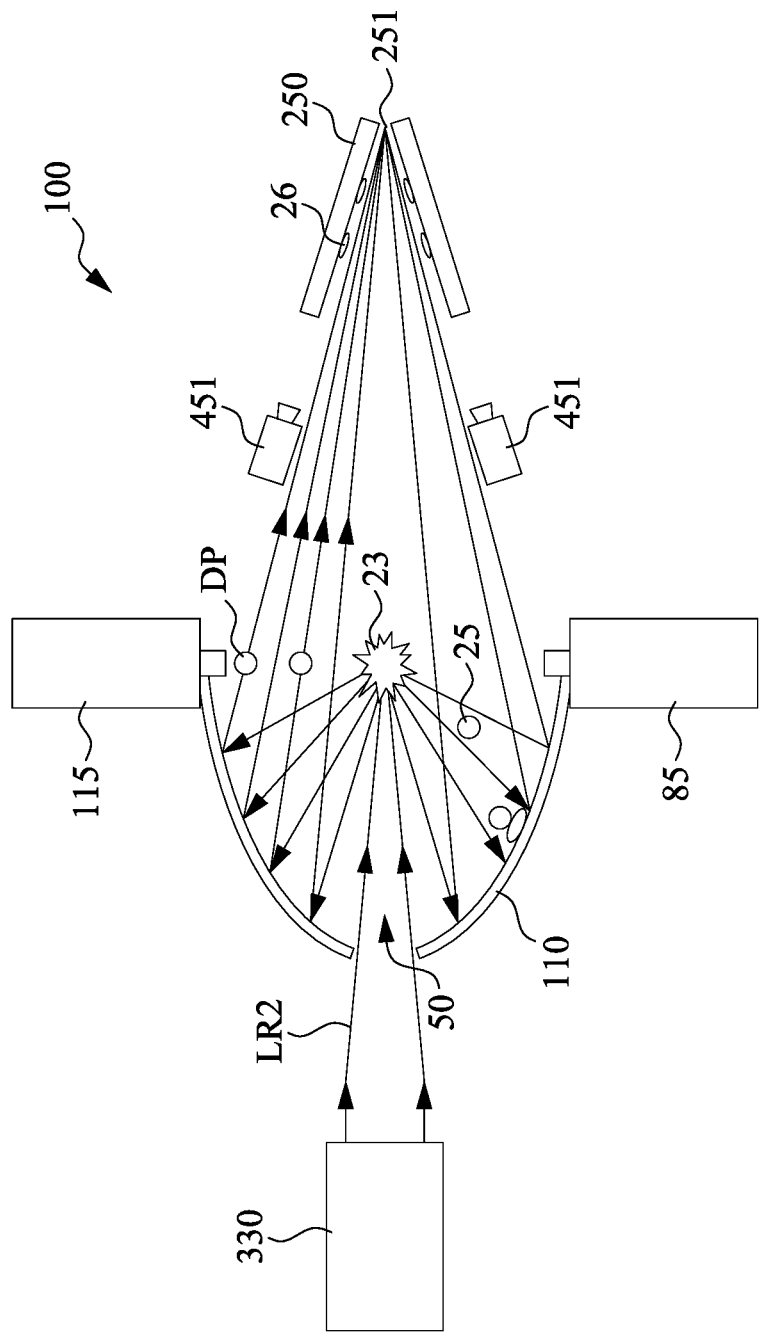
FIG. 4B illustrates an arrangement including multiple cameras for imaging the surface of the intermediate focus (IF)-cap module in accordance with some embodiments of the present disclosure.

FIG. 4B illustrates an arrangement including multiple cameras 451 for imaging the surface of the intermediate focus (IF)-cap module 250 for determining the level of tin debris 26 accumulated on the surface. FIG. 4B illustrates two cameras 451, however, in other embodiments, a single camera can be used to image the surface or more than 2 cameras can be used. As illustrated, the cameras are arranged adjacent the intermediate focus (IF)-cap module 250 (e.g., about the intermediate focus (IF)-cap module 250) in order to image the surface of the intermediate focus (IF)-cap module 250. The cameras 451 capture the image of the surface at desired intervals or continuously and the image is provided to a computer system 600 (FIGS. 6A and 6B, discussed below) for processing. The computer system 600 processes the images to determine the amount of accumulation of the tin debris 26 on the surface of the intermediate focus (IF)-cap module 250. When the tin debris 26 reaches or exceeds a pre-determined amount, the computer system 600 controls a laser generator (e.g., laser generator 500, FIG. 5) to irradiate the surface of the intermediate focus (IF)-cap module 250 with the high-frequency laser to remove the tin debris 26. As an example, the accumulation of the tin debris 26 is considered acceptable as long as the tin debris 26 does not enter the path of EUV radiation being transmitted to the exposure device 200. In other instances, the accumulation of the tin debris 26 is considered acceptable provided the thickness (or other dimension) of the tin debris 26 is below a pre-determined thickness. In other embodiments, the tin debris 26 accumulated is considered acceptable if the debris accumulation is within a pre-determined time period (e.g., days). Until the pre-determined time period, chances of Sn fall-on are assumed minimal. For instance, tin debris 26 accumulated over around 100 days of operation, is considered acceptable since the chances of fall-on of the tin debris 26 are minimal. The pre-determined time period may be obtained from historical data that is based on device operation, rate of Sn accumulation, thickness of tin debris, operating temperature, or the like.

Figure 5:
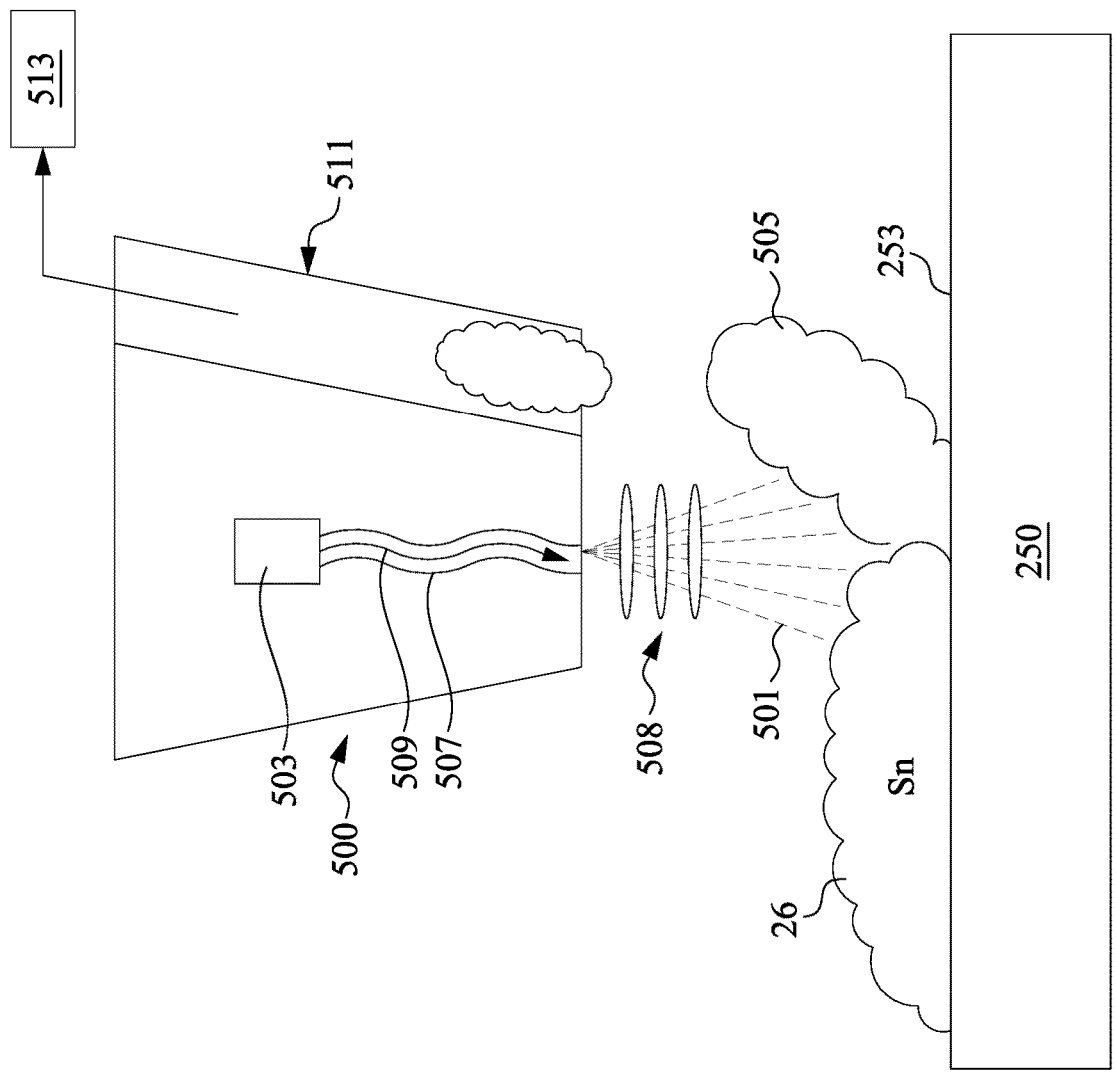
FIG. 5 illustrates a laser generator tool positioned to irradiate a laser on a surface of the intermediate focus (IF)-cap module, according to embodiments of the disclosure.

FIG. 5 illustrates a laser generator 500 arranged to irradiate a laser on debris 26 on a surface 253 of the intermediate focus (IF)-cap module 250, according to embodiments of the disclosure. In some embodiments, the laser generator 500 is a fiber laser generator that generates a laser in a pulse form. In some embodiments, the pulse rate of the laser is around 1 kHz to around 1000 kHz. In some embodiments, the pulse rate of the laser is around 1 kHz to around 500 kHz. In some embodiments, the pulse rate of the laser is less than around 1 kHz. In some embodiments, the pulse rate of the laser is greater than 1000 kHz. In some embodiments, the pulse rate of the laser is around 500 kHz to around 1000 kHz. The laser generator 500 includes a laser source 503 that generates a laser beam 509 that is provided to an optical fiber 507. In some embodiments, the laser generator 500 includes a system of lenses for focusing the laser beam before it is provided to the optical fiber 507. In some embodiments, the laser source 503 includes solid state, gas, excimer, dye, or semiconductor lasers that can generate infrared laser, visible-light laser or UV laser.

The laser generator 500 is configured to vary/adjust different parameters such as the wavelength, power, and/or pulse width of a laser beam 501 generated. For instance, the laser generator 500 includes one or more adjusting mechanisms that can adjust the different parameters as required. As illustrated, the laser generator 500 irradiates the laser beam 501 on the tin debris 26 on the surface 253 of the intermediate-focus (IF) cap module 250. In some embodiments, the laser generator 500 is configured to automatically or manually scan the laser beam 501 on the surface 253 of the intermediate-focus (IF) cap module 250 to remove tin debris accumulated on various regions of the intermediate-focus (IF) cap module 250. In some embodiments, a system of optics 508 (e.g., lens) is used for focusing the laser beam 501 on the surface 253 of the intermediate-focus (IF) cap module 250. In some embodiments, the system of optics is included in the laser generator 500. In other embodiments, the system of optics 508 is external to the laser generator 500. In some embodiments, the spot size of the laser is around 1 cm×1 cm. In some embodiments, the spot size can be adjusted.

When irradiated, the tin debris 26 is heated and is ionized due to a rapid increase in temperature thereof, and a plasma is formed. The plasma expands rapidly and the shock wave resulting from the rapid expansion vaporizes the tin debris 26.

A vacuuming tool 511 (or similar) coupled to a pump 513 is positioned over the surface 253 of the intermediate-focus (IF) cap module 250 and adjacent to the laser generator 500 (or other location) such that the vaporized tin (Sn) 505 can be vacuumed (sucked) away (indicated by arrows) from the surface as it is being generated. In some embodiments, the pump 513 may be or include a vacuum pump used to create a vacuum or a low pressure environment in the lithography system for the EUV lithography patterning. Operating the laser generator 500 and the vacuuming tool 511 simultaneously (or near simultaneously) ensures that the migration of the vaporized tin to other parts of the intermediate-focus (IF) cap module 250 (or other locations in the extreme ultraviolet lithography (EUVL) system) is reduced. However, in other embodiments, the laser generator 500 and the vacuuming tool 511 are operated sequentially for desired intervals. In some other embodiments, the vacuuming tool 511 is switched ON (operating) before the laser generator 500 is turned ON and switched OFF after the laser generator is turned OFF. In some embodiments, the vacuuming tool 511 is always ON. In some embodiments, the vacuuming tool 511 is turned ON and OFF intermittently during the operation of the laser generator 500.

In some embodiments, one or more cameras (e.g., cameras 451) are attached to the laser generator 500 to monitor the cleaning operation. In some embodiments, the orientation of the laser generator 500 is controlled such that an angle of incidence and/or the direction of propagation of the laser can be controlled such that the laser strikes (impinges) the tin debris deposited on the intermediate focus (IF)-cap module 250. The orientation of the laser generator 500 can be controlled manually irradiate the laser on different locations on the surface of the intermediate focus (IF)-cap module 250 based on the presence of tin debris 26. Alternatively, based on the level of accumulation as determined by the computer system 600 by processing the images of the tin debris 26, the computer system 600 automatically changes the orientation of the laser generator 500.

In some embodiments, the vacuuming tool 511 and the laser generator 500 are a single device. In some embodiments, the vacuuming tool 511 and the laser generator are separate tools. The positioning of the vacuuming tool 511 is not limited to any particular position over the surface 253 of the intermediate-focus (IF) cap module 250. The vacuuming tool 511 can be positioned and/or oriented as desired as long as the vacuuming tool 511 is able suck the vaporized tin (Sn) away from the surface and limit unintended migration of the vaporized tin. In some embodiments, when turned ON, the vacuuming tool 511 is capable of removing all of the vaporized tin (Sn) (or at least a majority thereof). In some embodiments, the vacuuming tool 511 is turned ON for around 1-2 seconds. In some embodiments, the vacuuming tool 511 is turned ON for around less than 1 second. In some embodiments, the vacuuming tool 511 is turned ON for around 2-5 seconds.

In some embodiments, the removal of the tin (or other) debris from the surface 253 of the intermediate-focus (IF) cap module 250 (or from other locations in the extreme ultraviolet lithography (EUVL) system) is performed as a maintenance (or similar) operation, during which operations performed in the extreme ultraviolet lithography (EUVL) system are shut down and the intermediate-focus (IF) cap module 250 (or other components of the extreme ultraviolet lithography (EUVL) system) is accessed (e.g., by dismantling the radiation source 100). The intermediate-focus (IF) cap module 250 (or the other components of the extreme ultraviolet lithography (EUVL) system) is then removed from the radiation source and are cleaned according to embodiments disclosed herein. In some embodiments, instead of removing the intermediate-focus (IF) cap module 250 (or other components to be cleaned), the laser generator 500 and the vacuuming tool 511 are introduced into the extreme ultraviolet lithography (EUVL) system to perform the cleaning operation. However, in other embodiments, the cleaning can be performed in situ, thereby reducing the downtime of the extreme ultraviolet lithography (EUVL) system. In some embodiments, in situ cleaning includes striking the intermediate-focus (IF) cap module 250 (or other components to be cleaned) using $CO_2$ laser.

The cleaning method, according to embodiments of the disclosure, offers many advantageous over the existing chisel and brush type (or other kinds of) cleaning tools and removes the debris from the intermediate-focus (IF) cap module 250 in a more efficient manner. The fiber laser limits generation of the debris particle cloud and thus limits contamination of the radiation source and EUV scanner and other parts of the extreme ultraviolet lithography (EUVL) system. Compared to existing techniques, more debris is removed from the intermediate-focus (IF) cap module 250 and thus a cleaner surface of the intermediate-focus (IF) cap module 250 is obtained. Because a cleaner surface is obtained each time the intermediate-focus (IF) cap module 250 is cleaned, the intermediate-focus (IF) cap module 250 needs to be cleaned less frequently, the clean life of the intermediate-focus (IF) cap module 250 is extended, and the intermediate-focus (IF) cap module 250 (or the extreme ultraviolet lithography (EUVL) system) downtime is substantially reduced. A cleaner intermediate-focus (IF) cap module 250 substantially reduces tin (Sn) spitting that occurs when the accumulated tin melts due to increase in temperature of the intermediate-focus (IF) cap module 250. Tin spitting causes the tin to travel to the EUV scanner and deposit on the reticle causing fabrication errors. By reducing tin spitting, contamination of the reticle is limited, thereby limiting system downtime and increasing productivity yield.

Figure 6A:
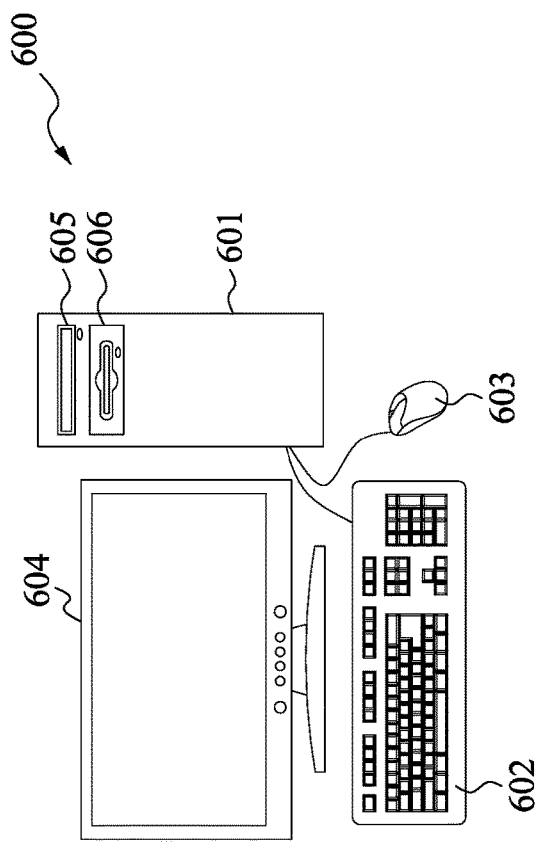
FIGS. 6A and 6B illustrate an apparatus for controlling the laser generator, the vacuuming tool, and performing other tasks discussed herein, according to some embodiments of the present disclosure.
Figure 6B:
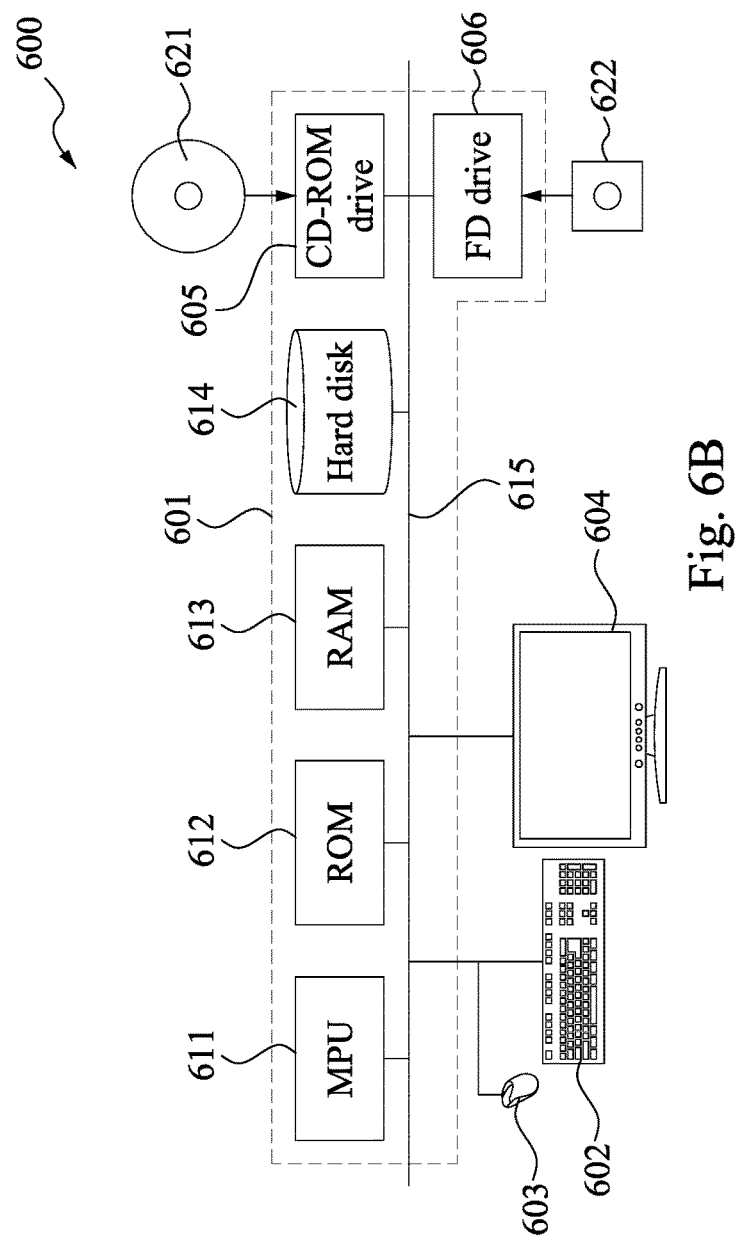

FIGS. 6A and 6B illustrate an apparatus for controlling the laser generator 500, the vacuuming tool 511, and performing other tasks discussed herein, according to some embodiments of the present disclosure. In FIG. 6A, a computer system 600 is provided with a computer 601 including an optical disk read only memory (e.g., CD-ROM or DVD-ROM) drive 605 and a magnetic disk drive 606, a keyboard 602, a mouse 603, and a monitor 604.

FIG. 6B is a diagram showing an internal configuration of the computer system 600. In FIG. 6B, the computer 601 is provided with, in addition to the optical disk drive 605 and the magnetic disk drive 606, one or more processors, such as a micro processing unit (MPU), a ROM 612 in which a program such as a boot up program is stored, a random access memory (RAM) 613 that is connected to the MPU 611 and in which a command of an application program is temporarily stored and a temporary storage area is provided, a hard disk 614 in which an application program, a system program, and data are stored, and a bus 615 that connects the MPU 611, the ROM 612, and the like. Note that the computer 601 may include a network card (not shown) for providing a connection to a LAN.

The program for causing the computer system 1100 to execute the operations disclosed in the foregoing embodiments may be stored in an optical disk 621 or a magnetic disk 622, which are inserted into the optical disk drive 605 or the magnetic disk drive 606, and transmitted to the hard disk 614. Alternatively, the program may be transmitted via a network (not shown) to the computer 601 and stored in the hard disk 614. At the time of execution, the program is loaded into the RAM 613. The program may be loaded from the optical disk 621 or the magnetic disk 622, or directly from a network.

An embodiment of the disclosure is a method that includes irradiating debris deposited in an extreme ultraviolet (EUV) lithography system with laser, controlling one or more of a wavelength of the laser or power of the laser to selectively vaporize the debris and limit damage to the EUV) lithography system, and removing the vaporized debris. In some embodiments, the laser is a fiber laser. In some embodiments, the debris is deposited on a surface of an intermediate focus (IF)-cap module of extreme ultraviolet (EUV) lithography system. In some embodiments, the debris includes tin and the power of the laser is controlled such that the debris is heated to a temperature of at least 230° C. to less than 1080° C. In some embodiments, the wavelength is controlled to be greater than around 600 nm. In some embodiments, the vaporized debris is vacuumed from the extreme ultraviolet (EUV) lithography tool. In some embodiments, a surface of the extreme ultraviolet (EUV) lithography tool including the debris is scanned with the laser. In some embodiments, prior to irradiating the debris, an amount of accumulation of the debris is determined, an operation of the extreme ultraviolet (EUV) lithography system is halted when the amount of accumulation is at or exceeds a desired level and a location in the extreme ultraviolet (EUV) lithography system that includes the debris is accessed. In some embodiments, the wavelength or the power is controlled such that the debris is heated to form plasma. In some embodiments, the laser is focused on the extreme ultraviolet (EUV) lithography system Another embodiment of the disclosure is a method that includes irradiating one or more tin droplet in a zone of excitation of an extreme ultraviolet (EUV) light source apparatus of an EUV lithography system with an excitation laser to generate EUV radiation, detecting for a presence of tin debris deposited on a surface of an intermediate focus (IF)-cap module of the extreme ultraviolet (EUV) light source apparatus, irradiating the tin debris with a pulsed laser, controlling a pulse width of the pulsed laser such that the tin debris is vaporized, cleaning the surface of an intermediate focus (IF)-cap module by removing the vaporized debris, and exposing a reticle to the EUV radiation for patterning a semiconductor substrate. In some embodiments, a fiber laser is used to generate the pulsed laser. In some embodiments, a power of the pulsed laser is controller such that the tin debris is heated to a temperature of at least 230° C. to less than 1080° C. In some embodiments, a wavelength of the pulsed laser is controlled to be greater than 600 nm. In some embodiments, the vaporized debris is vacuumed from the intermediate focus (IF)-cap module. In some embodiments, the surface of the intermediate focus (IF)-cap module is scanned with the pulsed laser. In some embodiments, the method further includes determining an amount of accumulation of the debris, halting an operation of the extreme ultraviolet (EUV) lithography system when the amount of accumulation is at or exceeds a desired level, accessing a location in the extreme ultraviolet (EUV) lithography system that includes the debris for irradiating the tin debris with the pulsed laser, and after cleaning the surface, resuming operation of the extreme ultraviolet (EUV) lithography system.

Still another embodiment of the disclosure is a debris cleaning apparatus that includes a laser source coupled to an optical fiber. The laser source is configured to generate a pulsed laser that is irradiated on tin debris deposited on a surface of an intermediate focus (IF)-cap module of an extreme ultraviolet (EUV) lithography system. The fiber laser generator is configured to control one or more of a wavelength of the pulsed laser and a power of the pulsed laser such that the tin debris is vaporized. The apparatus also includes a vacuuming tool to remove the vaporized tin debris to clean the surface of an intermediate focus (IF)-cap module. In some embodiments, the fiber laser generator is further configured to control the power of the pulsed laser so that the tin debris is heated to a temperature of at least 230° C. In some embodiments, the fiber laser generator is further configured to control the wavelength to be greater than 600 nm.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    irradiating metal debris deposited in an extreme ultraviolet (EUV) lithography system with a laser having a wavelength greater than absorption wavelengths of the metal debris and a material of the EUV lithography system;
    controlling a frequency of the laser to ionize the metal debris; and
    removing the metal debris.

2. The method of claim 1, wherein the laser is a fiber laser.

3. The method of claim 1, wherein the metal debris is deposited on a surface of an intermediate focus (IF)-cap module of the EUV lithography system.

4. The method of claim 1, wherein the metal debris includes tin and the method further comprises:
    controlling a power of the laser so that the metal debris is heated to a temperature of at least 230° C. to less than 1080° C.

5. The method of claim 1, wherein the wavelength of the laser is greater than around 600 nm.

6. The method of claim 1, wherein the laser vaporizes the metal debris and the metal debris is removed by vacuuming.

7. The method of claim 1, wherein irradiating the metal debris includes scanning a surface of the EUV lithography system including the metal debris with the laser.

8. The method of claim 1, wherein prior to irradiating the metal debris, the method comprises:
    determining an amount of accumulation of the metal debris;

halting operation of the EUV lithography system when the amount of accumulation is at or exceeds a desired level; and accessing a location in the EUV lithography system that includes the metal debris.

9. The method of claim 1, wherein controlling the frequency of the laser includes controlling the frequency such that the metal debris is heated to form a plasma.

10. The method of claim 1, wherein irradiating the metal debris using the laser includes focusing the laser on the EUV lithography system.

11. The method of claim 1, wherein a power of the laser is around 50 W to around 100 W.

12. A method comprising:
irradiating one or more tin droplet in a zone of excitation of an extreme ultraviolet (EUV) light source apparatus of an EUV lithography system with a first laser to generate EUV radiation, wherein the first laser is an excitation laser;
detecting for a presence of tin debris deposited on a surface of an intermediate focus (IF)-cap module of the EUV light source apparatus;
determining that accumulation of the tin debris is at or above a desired level;
irradiating the tin debris with a second laser having a wavelength greater than an absorption wavelength of the tin debris;
controlling a power of the second laser such that the tin debris is vaporized;
cleaning the surface of the IF-cap module by removing the vaporized debris; and
exposing a reticle to the EUV radiation for patterning a semiconductor substrate.

13. The method of claim 1, wherein a wavelength of the laser is greater than an absorption wavelength of a material of the EUV lithography system.

14. The method of claim 1, wherein a pulse rate of the laser is around 1 kHz to around 1000 kHz.

15. The method of claim 12, further comprising:
controlling the power of the second laser to heat the tin debris to a temperature of between 230° C. and 1080° C.

16. The method of claim 12, wherein the second laser is a fiber laser.

17. The method of claim 12, wherein the power of the second laser is around 50 W to around 100 W.

18. A debris cleaning apparatus, comprising:
a laser source configured to generate a pulsed laser for irradiating tin debris deposited on a surface of an intermediate focus (IF)-cap module of an extreme ultraviolet (EUV) lithography system, wherein the laser source is configured to control a frequency of the pulsed laser such that tin debris when irradiated is vaporized; and
a vacuuming tool positioned over the surface of the IF-cap module, the laser source and the vacuuming tool being operated simultaneously to remove the vaporized tin debris and reduce migration of the vaporized tin debris in the EUV lithography system.

19. The debris cleaning apparatus of claim 18, wherein the laser source is configured to heat the tin debris to a temperature of at least 230° C.

20. The debris cleaning apparatus of claim 18, wherein the pulsed laser has a wavelength greater than 600 nm.

* * * * *